(12) United States Patent
Berkhout

(10) Patent No.: US 8,519,694 B2
(45) Date of Patent: Aug. 27, 2013

(54) SWITCHABLE CURRENT SOURCE CIRCUIT AND METHOD

(75) Inventor: Marco Berkhout, Tiel (NL)

(73) Assignee: NXP B.V., Eindhoven (NL)

( * ) Notice: Subject to any disclaimer, the term of this patent is extended or adjusted under 35 U.S.C. 154(b) by 84 days.

(21) Appl. No.: 13/021,598

(22) Filed: Feb. 4, 2011

(65) Prior Publication Data

US 2011/0193613 A1   Aug. 11, 2011

(30) Foreign Application Priority Data

Feb. 10, 2010 (EP) .................................. 10153222

(51) Int. Cl.
*G05F 1/10* (2006.01)

(52) U.S. Cl.
USPC ............................ 323/315; 327/530; 327/538

(58) Field of Classification Search
USPC ........................................................ 323/315
See application file for complete search history.

(56) References Cited

U.S. PATENT DOCUMENTS

| | | | | |
|---|---|---|---|---|
| 4,983,929 A * | 1/1991 | Real et al. | | 330/288 |
| 5,179,301 A * | 1/1993 | Hughes | | 327/335 |
| 5,479,132 A * | 12/1995 | Verhaeghe et al. | | 327/553 |
| 5,952,884 A * | 9/1999 | Ide | | 330/288 |
| 6,107,789 A * | 8/2000 | Fryer et al. | | 323/316 |
| 6,236,252 B1 * | 5/2001 | Genest et al. | | 327/178 |
| 6,337,596 B1 * | 1/2002 | Shimozono | | 327/538 |
| 6,344,769 B1 | 2/2002 | Giuroiu | | |
| 6,389,275 B1 * | 5/2002 | Kawashima et al. | | 455/336 |
| 6,396,757 B1 * | 5/2002 | Quader et al. | | 365/208 |
| 6,462,527 B1 * | 10/2002 | Maneatis | | 323/315 |
| 6,466,080 B2 * | 10/2002 | Kawai et al. | | 327/538 |
| 6,798,245 B2 * | 9/2004 | Ohmae | | 326/82 |
| 7,075,358 B1 * | 7/2006 | Voo | | 327/538 |
| 7,202,655 B2 * | 4/2007 | Itoh | | 323/316 |
| 7,215,177 B2 * | 5/2007 | Sueoka | | 327/525 |
| 7,218,170 B1 * | 5/2007 | Carter et al. | | 327/552 |
| 7,248,100 B2 * | 7/2007 | Koizumi et al. | | 327/543 |
| 7,372,319 B1 | 5/2008 | Lee | | |
| 7,450,428 B2 * | 11/2008 | Martines et al. | | 365/185.2 |
| 7,508,184 B2 * | 3/2009 | Yen et al. | | 323/314 |
| 7,518,435 B2 * | 4/2009 | Kim et al. | | 327/538 |
| 7,636,016 B2 * | 12/2009 | Russell et al. | | 330/288 |
| 7,876,295 B2 * | 1/2011 | Marx | | 345/77 |
| 7,888,980 B2 * | 2/2011 | Li et al. | | 327/157 |
| 8,093,952 B2 * | 1/2012 | Behzad et al. | | 330/288 |
| 2002/0175738 A1 * | 11/2002 | Cyrusian | | 327/337 |
| 2004/0046600 A1 * | 3/2004 | Fujimoto et al. | | 327/518 |
| 2010/0289473 A1 * | 11/2010 | Ishii et al. | | 323/284 |
| 2012/0007660 A1 * | 1/2012 | Hummerston et al. | | 327/530 |

OTHER PUBLICATIONS

Extended European Search Report for European Patent Application No. 10153222.4 (Jul. 12, 2010).

* cited by examiner

*Primary Examiner* — Thomas J Hiltunen

(57) ABSTRACT

A method and circuit for providing a switched current source output has a precharge mode, in which a charge storage device is charged to a reference voltage, and the gate of an output transistor is discharged. In a discharge mode, the charge storage device is discharged to the gate of the output transistor to raise the gate voltage by an amount depending on the charge flow.

14 Claims, 6 Drawing Sheets

SWITCHABLE CURRENT SOURCE CIRCUIT AND METHOD

This application claims the priority under 35 U.S.C. §119 of European patent application no. 10153222.4, filed on Feb. 10, 2010, the contents of which are incorporated by reference herein.

FIELD OF THE INVENTION

This invention relates to switchable current source circuits, i.e. circuits that provide a desired current at their output and can be switched on or off.

BACKGROUND OF THE INVENTION

An important aspect of switching electronic circuits such as class-D amplifiers and switch-mode power supplies is electro-magnetic compatibility (EMC).

One of a few measures that can be taken in a switching design to improve EMC performance is to slow down the transition speed of the output voltage node. This is commonly referred to as 'slope control'. A well-known method of obtaining a constant slope at the output when turning on a power MOSFET is to exploit the feedback Miller-effect of the parasitic gate-drain capacitance Cgd of the power MOSFET.

FIG. 1 shows an example of power MOSFET with slope control when turning the transistor on. The gate drain capacitance Cgd and the diode are part of the transistor equivalent circuit.

In the circuit configuration shown in FIG. 1, the gate of power transistor Mpower is charged by a current source Icharge. The graph on the right-hand side of FIG. 1 shows the voltage transients of the gate voltage Vgate and output voltage Vout.

Initially, transistor Mpower is turned off and the output voltage Vout is high, i.e. near to the supply voltage. The gate voltage Vgate increases steadily until it reaches the threshold voltage VT of the power transistor Mpower. At this point in time, Mpower starts to conduct and pulls down the output node Vout. During the transition of the output node Vout, a large rate of change of voltage (dV/dt) appears across the parasitic gate-drain capacitance Cgd causing all available current Icharge to flow into Cgd.

Consequently, the gate voltage Vgate remains almost the same during the output transition yielding a characteristic pedestal in the gate voltage transient. After the transition of the output node has finished, the gate voltage is charged further until it reaches its final value. The rate of change or 'slope' of the output voltage Vout during the transition is controlled by the magnitude of the current Icharge and the parasitic gate-drain capacitance Cgd:

$$\frac{d}{dt}V_{out} = \frac{I_{charge}}{C_{gd}} \tag{1}$$

Transition times typically are of the order of a few tens of nanoseconds. In order to obtain a constant slope during the transition, a current source Icharge is required that can be switched on and settle very fast.

This invention relates to the control of a transistor functioning as a current switch. The term "current switch" refers to an accurate current source that can be switched on and off.

The most basic circuit implementation of a current switch is shown in FIG. 2.

The circuit comprises a reference current source Iref. The current source current is mirrored to the output Iout by a current mirror circuit that comprises input and output transistors Min and Mout. The current mirror circuit is essentially turned on and off by a control transistor Mctrl, which is used to short the two current mirror transistors to turn them rapidly off.

When the control signal ctrl is high, transistor Mctrl is turned on and it shorts the gates of Min and Mout to ground. The current switch is off and the output current Iout is zero. When the control signal ctrl is low, transistor Mctrl is turned off and the reference current Iref is mirrored through Min and Mout. The output current Iout is now equal to the reference current Iref multiplied by the size ratio between Min and Mout.

Many alternative implementations are known that improve the speed and/or the accuracy of the current mirror. A number of alternatives is shown in FIG. 3.

The configuration shown in FIG. 3(a) has a unity-gain buffer A0 that decouples the gate of output transistor Mout from the input node. When Mout is very large, this improves the speed of the current mirror since the charge to load the gate of Mout is now sourced by the amplifier instead of the input reference current Iref. However, the input transistor Min and the unity-gain buffer form a feedback loop that can become unstable.

In the configuration shown in FIG. 3(b) the input transistor Min is diode-connected and the unity-gain buffer A0 copies the gate voltage of Min to the gate of Mout without forming a feedback loop. Because there is no feedback loop, this configuration will have no stability problems but it is less accurate because the finite gain and offset of amplifier A0 will introduce an error.

In the configuration shown in FIG. 3(c), the inverting input of amplifier A0 is connected to the output node. In this configuration, the feedback loop that is now formed by the amplifiers and both transistors Min and Mout forces the input voltage to be equal to the output voltage. Since now both transistors have the same gate-source voltage as well as the same drain-source voltage, the accuracy of the mirror is greatly improved. However, the stability of the feedback loop now depends on the impedances connected to the input and output.

A particular problem with the current switch shown in FIG. 2 appears when the ratio between input transistor Min and output transistor Mout is very large, e.g. 1:1000. In this case, turn-on of the current switch becomes very slow since the current that charges the gate of Mout needs to be provided by the input reference current Iref. The alternatives shown in FIG. 3 solve this problem but can have problems with stability.

Also, in order to achieve a very high speed, the amplifier used in these configurations requires a lot of power. Note that turning off a current switch is less of a problem; any desired speed can readily be achieved by appropriate dimensioning of transistor Mctrl.

There is a need for a switchable current source circuit in which turn on speed is increased without introducing possible instability.

SUMMARY OF THE INVENTION

According to the invention, there is provided a switching circuit for providing a switched current source output, comprising:
a reference voltage input device;
a charge storage device for storing the reference voltage;

an output transistor;

an isolating switch for selectively coupling or isolating the gate of the output transistor to or from the charge storage device; and a discharge switch for discharging the gate of the output transistor.

When a current switch is turned on, the amount of charge that is required to increase the gate voltage of output transistor to the same level as that of input transistor Min is to the first order constant. The invention provides a solution to the turn-on speed problem by precharging a charge storage device of appropriate size up to a voltage that is higher than the desired gate voltage of the output transistor and then discharging the charge storage device onto the gate of the output transistor by means of a switch. This means that the control of the gate voltage of the output transistor is based on the required amount of charge to be supplied to the gate (because the initial condition of the output transistor is known when it is discharged) rather than based on the desired voltage. Thus, the invention provides controlled charge flow to the output transistor gate rather than the application of a controlled voltage.

The switching circuit is preferably operable in two modes:

a precharge mode, in which the charge storage device is precharged to the reference voltage and the output transistor gate is discharged through the discharge switch, and the isolating switch isolates the charge storage device from the output transistor gate; and a discharge mode, in which the charge storage device is discharged to the transistor gate through the isolating switch.

The precharge mode both charges the charge storage device and resets the output transistor so that the starting conditions, before the transfer of charge, are known.

The charge storage device can comprise the gate capacitance of a transistor.

The reference voltage input device can comprise a transistor having its gate and drain connected together and connected to a reference current source. With the transistor in saturation, the voltage on the drain can define a stable reference voltage based on a constant input current.

A first reference voltage transistor and a second reference voltage transistor can be provided, with their sources coupled together and their drains coupled together and the charge storage device between the common source and the common drain, wherein the isolating switch is between the common drain and the gate of the output transistor.

The use of two reference voltage transistors enables the voltage of the charge storage device to be controlled to discharge from one defined voltage to another defined voltage, improving the control of the circuit.

An input stage and at least one output stage can be provided, wherein the input stage comprises:

the reference voltage input device and a first charge storage device, and wherein the or each output stage comprises:

a second charge storage device, the isolating switch, the discharge switch and the output transistor.

By splitting the charge storage device into two, separation between an input stage and an output stage can be provided, in particular with no (or minimal) current flowing between the stages.

The reference voltage input device of the input stage can comprise:

a first reference voltage transistor and a second reference voltage transistor with their sources coupled together and their drains coupled together and the charge storage device between the common source and the common drain;

an input stage isolating switch between the common drain and the gate of the second reference voltage transistor; and an input stage discharge switch between the gate of the second reference voltage transistor and the common source.

A plurality of output stages and a single input stage can be provided, wherein each output stage is connected to the input stage through a respective enable switch. This enables the output current to be controllable by selecting the number of output stages which are enabled.

Preferably, the reference voltage is higher than the voltage of the output transistor gate required to provide the desired output current, wherein the charge corresponding to a drop in voltage of the charge storage device to said required output transistor gate voltage corresponds to the charge required to charge the output transistor gate from the discharged state to said required output transistor gate voltage. This provides the charge based control described above.

The invention also provides a method for providing a switched current source output, comprising:

in a precharge mode, charging a charge storage device to a reference voltage, and discharging the gate of an output transistor; and in a discharge mode, discharging the charge storage device to the gate of the output transistor to raise the gate voltage by an amount depending on the charge flow.

BRIEF DESCRIPTION OF THE DRAWINGS

Examples of the invention will now be described in detail with reference to the accompanying drawings, in which:

FIG. 1 shows a known example of power MOSFET with slope control when turning the transistor on;

FIG. 9 shows a simulated transient turn-on response of a current switch design with thirty-two output sections; and.

DETAILED DESCRIPTION OF EMBODIMENTS

The invention provides a switching circuit for providing a switched current source output, in which the gate of the output transistor is driven by a charge storage device. A precharging operation for the charge storage device enables an increase in speed for the output current when the circuit is switched to deliver the desired output current.

Figure 4:
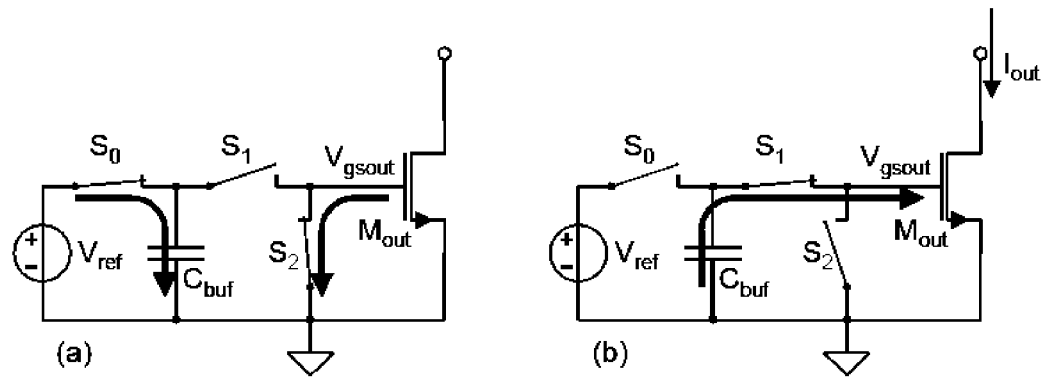
FIGS. 4(*a*) and (*b*) are used to explain conceptually the operation of the circuit of the invention.

FIG. 4 is used to explain conceptually the operation of the circuit of the invention, in where there are two phases; a precharge phase (FIG. 4(*a*)) and a discharge phase (FIG. 4(*b*)).

The circuit comprises a buffer capacitor Cbuf which can be charged to a reference voltage Vref through an input switch S0. The charged buffer capacitor is connected to the gate of the power transistor Mout through an output switch 51. This is an isolating switch, in that it can isolate the buffer capacitor from the output transistor or it can allow the charge from the buffer capacitor to flow to the gate of the output transistor. Furthermore, the gate of the power transistor can be discharged to ground through a discharge switch S2.

In this configuration only the impedance of the output switch 51 limits the turn-on speed and there are no stability problems because no feedback loops are used.

In the precharge phase shown in FIG. 4(a), the buffer capacitor is charged to the reference voltage while the gate of the transistor is grounded. The output/isolating switch S1 isolates the capacitor charging circuit from the gate discharge circuit.

In the discharge phase shown in FIG. 4(b), the charge stored on the buffer capacitor is used to charge the transistor gate.

The relation between drain-current ID and gate-source voltage Vgs of a MOS transistor in saturation is given by the well-known square-law formula:

$$I_D = \frac{1}{2}\mu C_{ox} \frac{W}{L}(V_{gs} - V_T)^2 \quad (2)$$

where μ is the mobility of electrons in the channel, Cox is the capacitance (per unit area) of the oxide layer separating the gate from the channel W and L are the width and length of the channel and VT is the threshold voltage.

Equation (2) can be rewritten to give the target gate-source voltage Vgsout that corresponds to a target drain-current IDout:

$$V_{gsout} = V_T + \sqrt{\frac{I_{Dout}}{\frac{1}{2}\mu C_{ox}} \frac{L_{out}}{W_{out}}} \quad (3)$$

Assuming a constant capacitance Cox, the amount of charge Qg needed to reach this voltage is:

$$Q_g = (V_{gsout} - V_T) C_{ox} W_{out} L_{out} \quad (4)$$

The threshold voltage VT appears in equation (4) to account for the fact that the gate capacitance of a MOS capacitor is much smaller below the threshold voltage.

In equation (4) the gate capacitance is assumed zero below the threshold voltage and equal to CoxWoutLout above. This is a coarse approximation, but this does not undermine the ability for correct operation of the circuit. The amount of charge Qbuf provided by a capacitor Cbuf that is being discharged from a voltage Vref to a (target) voltage Vgsout equals:

$$Q_{buf} = (V_{ref} - V_{gsout}) C_{buf} \quad (5)$$

Combining equations (4) and (5), the reference voltage Vref required to produce the target gate-source voltage Vgsout is:

$$V_{ref} = (V_{gsout} - V_T)\left(1 + \frac{C_{ox} W_{out} L_{out}}{C_{buf}}\right) + V_T \quad (6)$$
$$= (V_{gsout} - V_T)(1 + \alpha) + V_T$$

When capacitor Cbuf is implemented with a MOS transistor Mbuf with the same gate-oxide as used in Mout, the relation between Vref and Vgsout depends only on the ratio α of the gate areas of Mbuf and Mout and the threshold voltage VT. By choosing a value α, the corresponding value of the reference voltage Vref can be calculated by substituting equation (3) into (6):

$$V_{ref} = V_T + (1 + \alpha)\sqrt{\frac{I_{Dout}}{\frac{1}{2}\mu C_{ox}} \frac{L_{out}}{W_{out}}} \quad (7)$$

Figure 5:
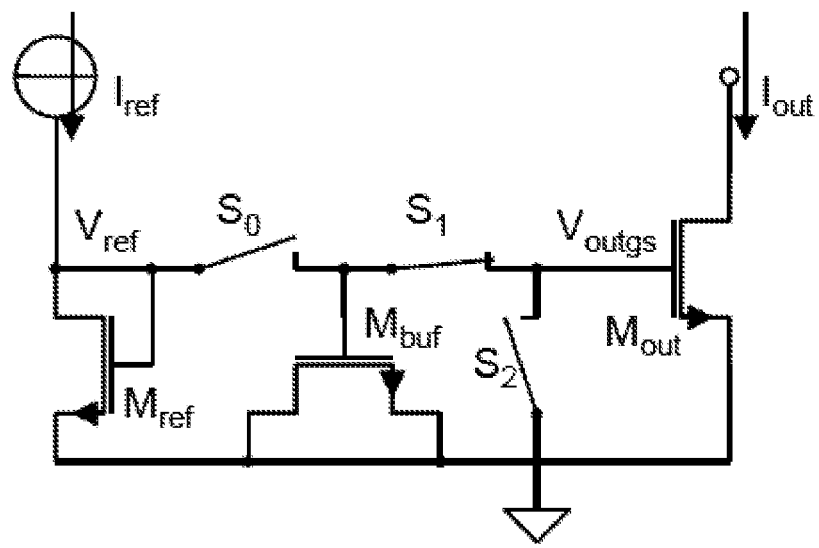
FIG. 5 shows an implementation of storage capacitor and reference voltage for the circuit of FIG. 4.

Equation (7) has the same form as equation (3). This suggests that biasing a diode connected MOS transistor Mref with a reference current Iref can be used to generate an appropriate reference as shown in FIG. 5, which shows an implementation of the storage capacitor and reference voltage generation circuit using transistors.

The device for generating a reference voltage input is implemented as a transistor Mref having its gate and drain connected together and connected to a reference current source Iref. The charge storage device comprises the gate capacitance of a transistor Mbuf, which has its source and drain connected together.

In this way, the dependence on threshold voltage VT, mobility μ and oxide capacitance Cox is eliminated and the output current IDout only depends on the reference input current Iref and the ratios of geometrical dimensions:

$$V_{ref} = V_T + \sqrt{\frac{I_{Dout}}{\frac{1}{2}\mu C_{ox}} \frac{L_{out}}{W_{out}}(1+\alpha)^2} = V_T + \sqrt{\frac{I_{ref}}{\frac{1}{2}\mu C_{ox}} \frac{L_{ref}}{W_{ref}}} \quad (8)$$

$$I_{Dout} = I_{ref} \frac{\frac{L_{ref}}{W_{ref}}}{\frac{L_{out}}{W_{out}}(1+\alpha)^2} \quad (9)$$

In reality, MOS transistors deviate from the square-law given in equation (2) and also the voltage dependence of the gate-capacitance is more complex than assumed in this derivation. However, equation (9) is sufficiently accurate for an initial calculation of device dimensions. Simulation can be used to further fine-tune the results and thereby derive the required transistor dimensions for correct circuit operation.

It will be understood therefore that the mathematical derivations are intended to demonstrate the concept of the invention, rather than provide full details of the exact derivation of required transistor dimensions.

A first example embodiment of the fast current switch described above is shown in FIG. 6.

In this embodiment, the reference transistor Mref is split in two parts: Mrefa and Mrefb.

Thus, transistor Mrefa is a first reference voltage transistor and Mrefb is a second reference voltage transistor. They are arranged in parallel, with their sources coupled together and their drains coupled together. The buffer capacitor Mbuf is between the common source and the common drain. The isolating switch S1 is between the common drain and the gate of the output transistor Mout.

In this circuit, there is no switch corresponding to S0 in FIGS. 4 and 5. This is because during the discharge phase, the reference current plays a role in determining the final voltage on the buffer capacitor, as explained below. The switches S1 and S2 correspond to those in FIGS. 4 and 5.

During the precharge phase, S2 is closed shorting the gate of Mout (and Mrefb) to ground while S1 is opened and the reference current Iref charges the gate of Mbuf to a value Vref that is determined by the dimensions of Mrefa.

During the discharge phase, S2 is opened and S1 is closed allowing charge to flow from the gate of Mbuf to the gates of Mout (and Mrefb). Now Mrefb is connected in parallel to Mrefa effectively changing the W/L ratio of the reference diode and lowering the reference voltage Vref. In this way, the gate voltage of Mout is not left floating after the charge transfer from Mbuf has completed but settles to the new, lower reference voltage Vref.

By appropriate dimensioning of Mrefa and Mrefb the lower reference voltage Vref can be made equal to the target gate voltage Vgsout of the output transistor Mout.

Thus, the capacitor is actively driven to the desired end voltage, rather than the end voltage only being the result of charge sharing between the output transistor gate and the buffer capacitor.

Figure 7:
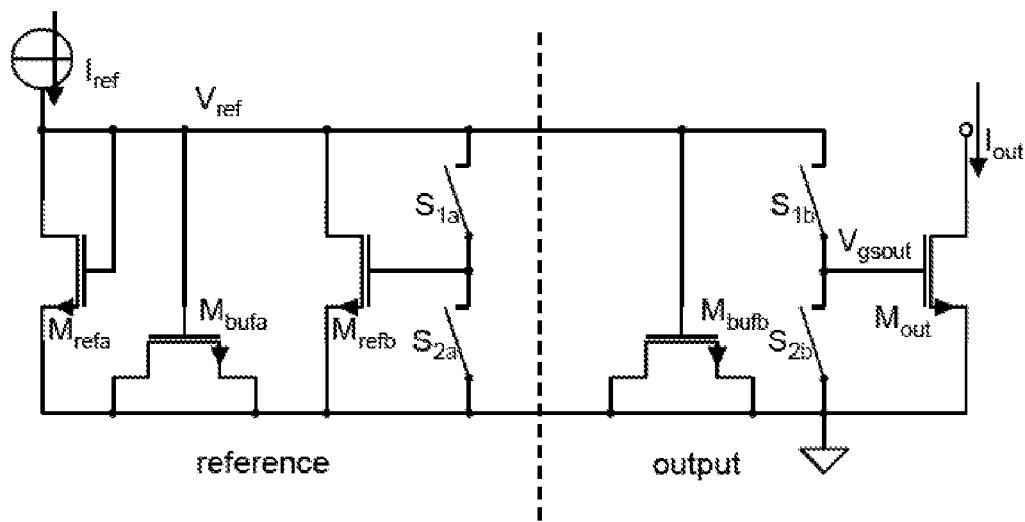
FIG. 7 is a second detailed example of circuit of the invention.

In an alternative embodiment shown in FIG. 7 the buffer capacitor Mbuf is also split into two parts: Mbufa and Mbufb.

FIG. 7 also shows the circuit being divided into an input stage and an output stage. The input stage comprises the reference voltage transistors Mrefa and Mrefb and a first charge storage device (i.e. transistor) Mbufa.

The output stage comprises a second charge storage device Mbufb, the isolating switch, the discharge switch and the output transistor.

Figure 6:
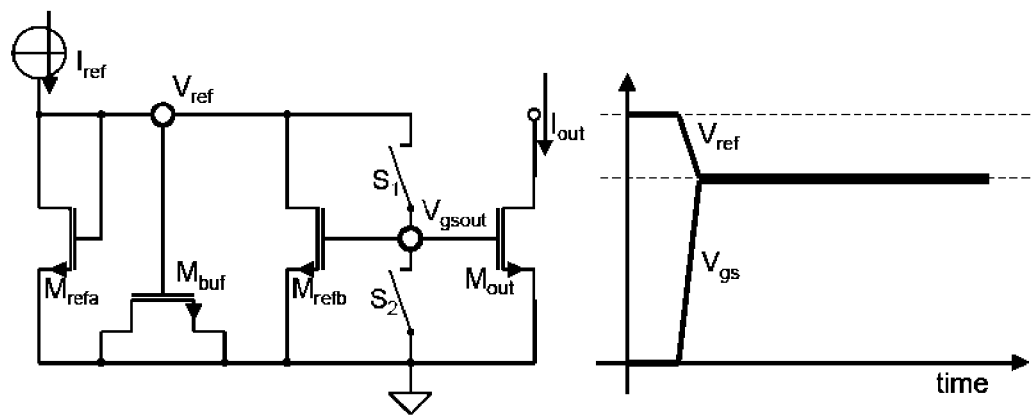
FIG. 6 is a first detailed example of circuit of the invention.

As in FIG. 6, the input stage also has a first reference voltage transistor Mrefa and a second reference voltage transistor Mrefb with their sources coupled together and their drains coupled together and the first charge storage device between the common source and the common drain.

The input stage has an input stage isolating switch S1a between the common drain and the gate of the second reference voltage transistor Mrefb, and an input stage discharge switch S2a switch between the gate of the second reference voltage transistor Mrefb and the common source.

The division of the buffer capacitors (and the associated switched) is made such that during the discharge phase the charge drawn from Mbufb exactly matches the charge flowing towards the gate of Mout. Consequently, there will be no current flowing between the input and output stages, i.e. across the dashed line in FIG. 7.

Figure 8:
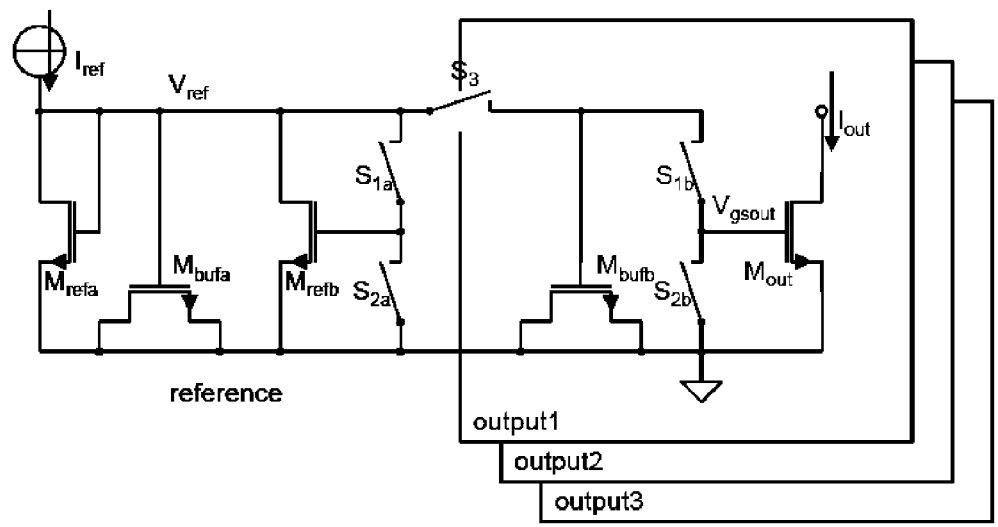
FIG. 8 shows the current switch of FIG. 7 with multiple output sections.

The (output) circuit on the right-hand side of the dashed line is thus virtually invisible to the (reference) circuit on the left-hand side. The advantage of this arrangement is that multiple output circuits can be attached to a single reference circuit as shown in FIG. 8, which shows a current switch with multiple output sections.

By inserting an additional enable switch S3 in between each output circuit and the reference circuit, the magnitude of the output current Iout can now be adjusted.

Figure 9:
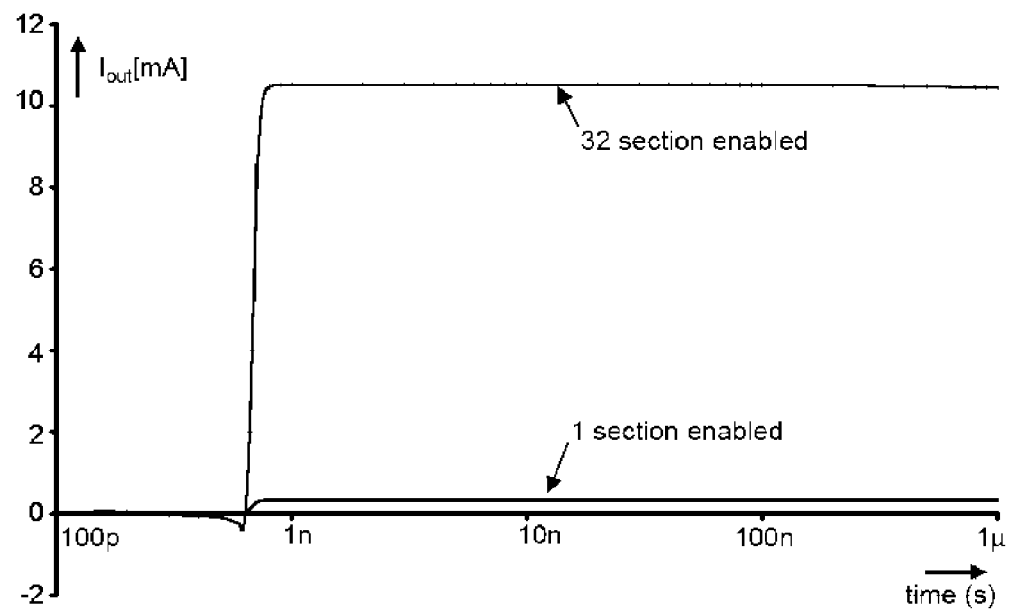

A simulated transient turn-on response of a current switch design with thirty-two output sections is shown in FIG. 9. This current switch design uses a 10 µA reference current and has a maximum output current of about 10 mA; a ratio of about 1:1000. A logarithmic time scale has been used to enhance the details of the transient behaviour.

For the bottom trace only one output section is enabled, for the top trace all sections are enabled. As can be seen, both traces settle within 1 ns and remain stable afterwards.

Figure 1:
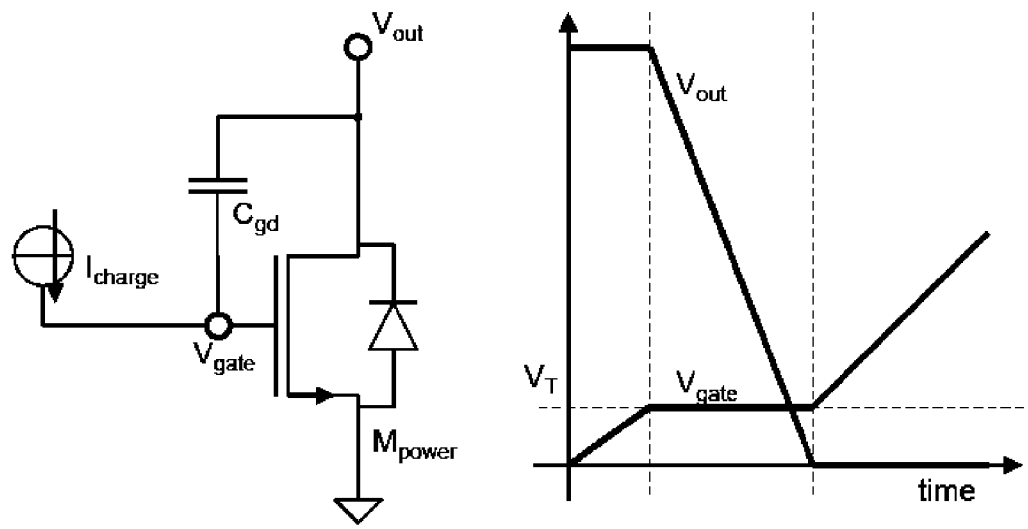
Figure 2:
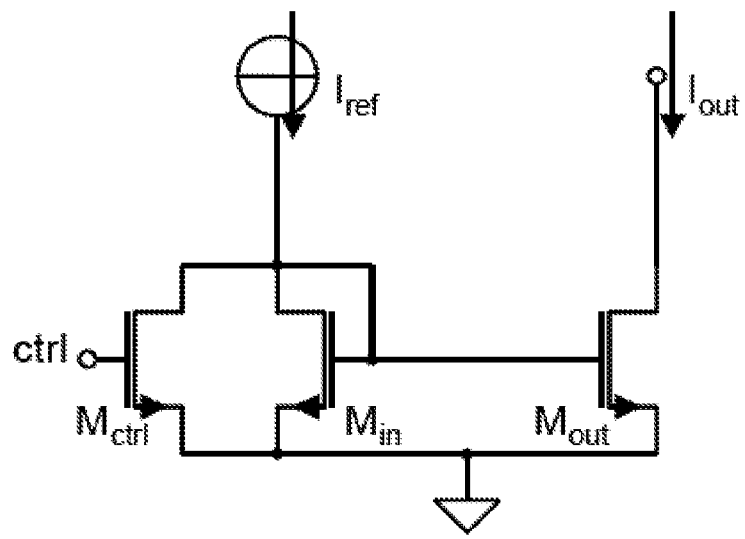
FIG. 2 shows a known basic circuit implementation of a current switch.
Figure 3:
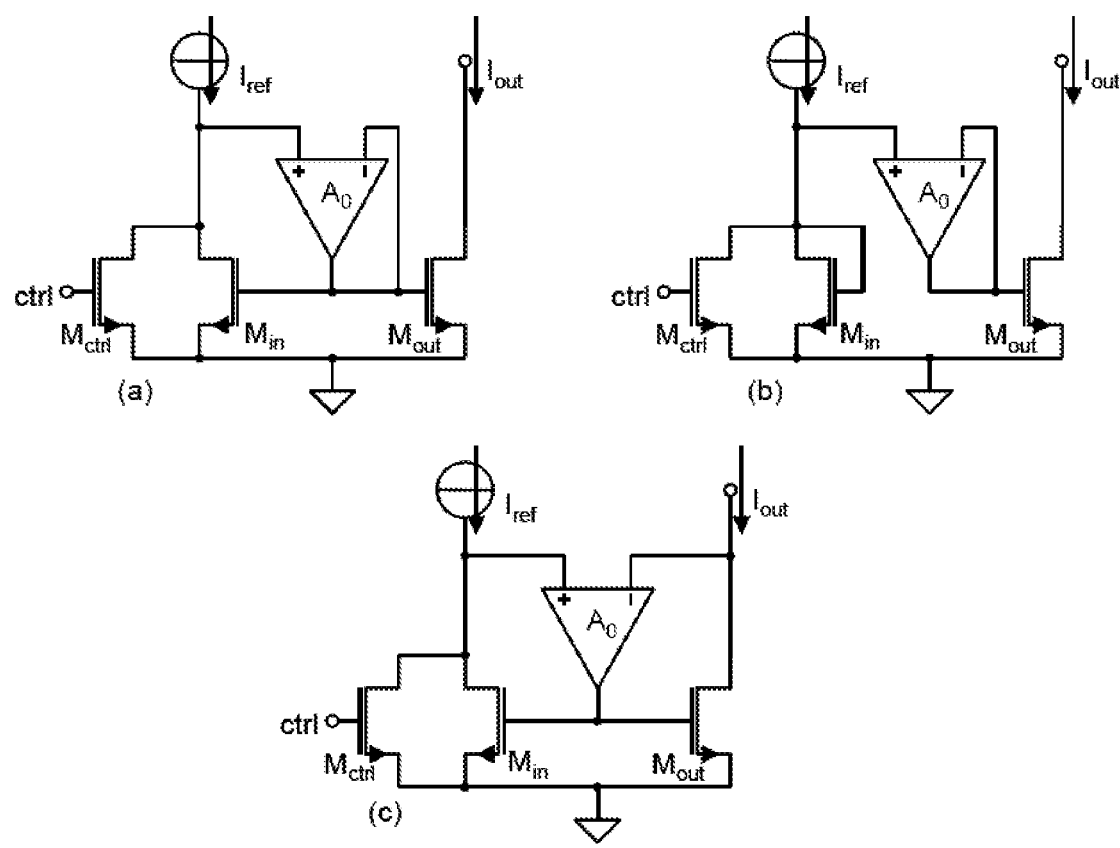
FIG. 3 shows a number of alternatives to the current switch circuit of FIG. 2.
Figure 10:
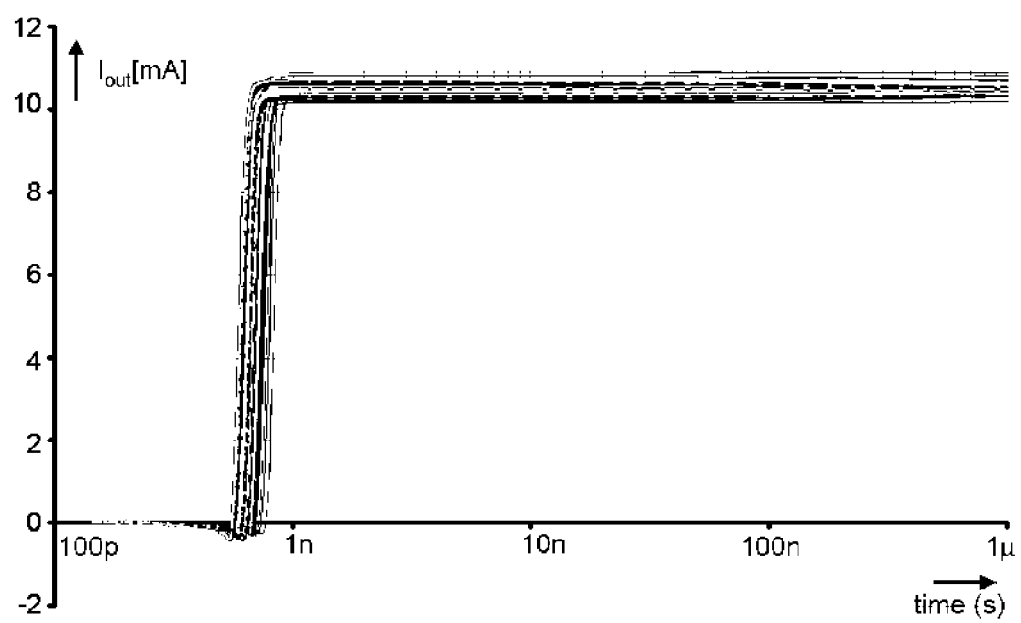
FIG. 10 shows an analysis for 64 trials of the circuit of the invention.

An analysis (Monte-Carlo analysis) over 64 trials is shown in FIG. 10. As can be seen, the speed and settling behaviour is hardly influenced by mismatch. The spread in the final output current value is due to mismatch between the input and output transistors and are compatible with mismatch obtained from a standard 1:1000 current mirror such as the one shown in FIG. 2.

All embodiments shown are current sinks using NMOS transistors but the same techniques can be applied to realize current sources using PMOS transistors as well.

The invention enables a very large current mirror ratio to be achieved, namely the ratio between Iref and Iout.

The switches shown in the figures are of course also implemented as transistors, in routine manner.

The reference voltage device has been shown as a transistor driven with a reference current. However, the reference voltage device could be a voltage source, in which case the device also implements voltage to current conversion To give an indication of the typical dimensions and relative sizes of the devices used in the circuit, one example for the circuit of FIG. 7 is as follows:

Mrefa Width/Length of 1.5 µm/6.0 µm
Mrefb Width/Length of 1.0 µm/6.0 µm
Mbufa with capacitance of 0.6 pF
Mout Width/Length of 225 µm/0.6 µm
Mbufb with capacitance of 7 pF The reference voltage is around 1.5V compared to the required gate voltage on the output transistor Vgsout of 1.1V.

It can be seen that the width to length ratio of the output transistor in the example above is 1500 times larger than the width to length ratio of the input transistor Mrefa. Generally, the circuit enables the output transistor to have a width to length ratio more than 500 times the length to width ratio of the input transistor through which the reference current passes during the precharge phase.

The invention achieves slope control in switching output stages. Such stages are part of class-D amplifiers and also switch-mode power supplies. There are other applications, for example in D/A converters.

Various modifications will be apparent to those skilled in the art.

The invention claimed is:

1. A switching circuit for providing a switched current source output, comprising:
   a reference voltage input device including a transistor having a gate and a drain connected together and connected to a reference current source;
   a charge storage device for storing a first reference voltage;
   an output transistor being configured and arranged under control of a gate voltage;
   an isolating switch for selectively coupling or isolating a gate of the output transistor to or from the charge storage device;
   a discharge switch for discharging the gate of the output transistor;
   wherein the switching circuit is operable in both:
      a precharge mode, in which the reference voltage input device provides the first reference voltage to the charge storage device, the charge storage device is precharged to the first reference voltage, the output transistor gate is discharged through the discharge switch, and the isolating switch isolates the charge storage device from the output transistor gate, and
      a discharge mode in which the reference voltage input device provides a second reference voltage to the charge storage device, the charge storage device is discharged to the transistor gate through the isolating switch until the voltage input device reaches the second reference voltage; and
   wherein the control of the gate voltage at the output transistor gate is provided by a controlled charge flow rather than application of a controlled voltage.

2. A circuit as claimed in claim 1, wherein the charge storage device comprises a gate capacitance of a transistor.

3. A circuit as claimed in claim 1, further comprising an input stage and at least one output stage, wherein the input stage comprises:
the reference voltage input device and a first charge storage device,
and wherein each output stage comprises:
a second charge storage device, the isolating switch, the discharge switch and the output transistor.

4. A circuit as claimed in claim 1, wherein the first voltage is higher than a voltage of the output transistor gate required to provide a desired output current, wherein the charge corresponding to a drop in voltage of the charge storage device to said required output transistor gate voltage corresponds to a charge required to charge the output transistor gate from the discharged state to the required output transistor gate voltage, the required output transistor gate voltage being equal to the second reference voltage.

5. A circuit as claimed in claim 1, wherein the charge storage device is coupled to the gate of the transistor of the reference voltage input device.

6. A circuit as claimed in claim 1, wherein the reference voltage input device further includes:
a second transistor having a drain coupled to the reference current source and a source coupled to a common reference voltage; and
a circuit configured and arranged to:
connect a gate of the second transistor to the reference current source in response to the switching circuit operating in the discharge mode; and
connect the gate of the second transistor to the common reference voltage in response to the switching circuit operating in the precharge mode.

7. A circuit as claimed in claim 1, wherein the reference voltage input device is configured and arranged to cause the transistor exhibit a lower threshold gate voltage in response to the switching circuit operating in the discharge mode and exhibit a higher threshold gate voltage in response to the switching circuit operating in the precharge mode.

8. A switching circuit for providing a switched current source output, comprising:
a reference voltage input device;
a charge storage device for storing a reference voltage;
an output transistor;
an isolating switch for selectively coupling or isolating a gate of the output transistor to or from the charge storage device;
a discharge switch for discharging the gate of the output transistor;
at least one output stage, each including a second charge storage device, the isolating switch, the discharge switch and the output transistor; and
an input stage including:
the reference voltage input device and a first charge storage device,
a first reference voltage transistor and a second reference voltage transistor with their sources coupled together and their drains coupled together and the charge storage device between the common source and the common drain,
an input stage isolating switch between the common drain and the gate of the second reference voltage transistor, and
an input stage discharge switch between the gate of the second reference voltage transistor and the common source.

9. A circuit as claimed in claim 8, further comprising a plurality of output stages and a single input stage, wherein each output stage is connected to the input stage through a respective enable switch.

10. A method for using a switching circuit to provide a switched current source output, the switching circuit having a reference voltage input device, an output transistor, a charge storage device for storing a first voltage, an isolating switch, and a discharge switch, the method comprising:
for the reference voltage input device, providing a transistor having a gate and a drain connected together and connected to a reference current source;
using the isolating switch for selectively coupling or isolating a gate of the output transistor to or from the charge storage device, and the discharge switch for discharging the gate of the output transistor;
in a precharge mode, using the reference voltage input device to provide the first reference voltage to the charge storage device and to charge the charge storage device to the first reference voltage, and discharging the gate of the output transistor; and
in a discharge mode, discharging the charge storage device to the gate of the output transistor to raise the gate voltage to a second reference voltage, and using the reference voltage input device to provide the second reference voltage to the charge storage device; and
wherein the control of the gate voltage at the output transistor gate is provided by a controlled charge flow from the charge storage device rather than application of a controlled voltage.

11. A method as claimed in claim 10, wherein the charge storage device comprises a gate capacitance of a transistor.

12. A method as claimed in claim 10, further comprising defining the reference voltage by coupling a reference voltage transistor to a reference current source.

13. A method for using a switching circuit to provide a switched current source output, the switching circuit having a reference voltage input device, an output transistor, a charge storage device for storing a reference voltage, an isolating switch, and a discharge switch, the method comprising:
for the reference voltage input device, providing a transistor having a gate and a drain connected together and connected to a reference current source;
using the isolating switch for selectively coupling or isolating a gate of the output transistor to or from the charge storage device, and the discharge switch for discharging the gate of the output transistor;
in a precharge mode, providing a first reference voltage from the reference voltage input device to the charge storage device, and discharging the gate of the output transistor;
in a discharge mode, providing a second reference voltage from the reference voltage input device to the charge storage device, and discharging the charge storage device to the gate of the output transistor to raise the gate voltage by an amount depending on a charge flow; and
supplying a reference current from a reference current source to the reference voltage input device and providing output currents from a plurality of output stages.

14. A method as claimed in claim 13, further comprising selecting plurality of the output stages using respective enable switches.

* * * * *